(12) United States Patent
Müller et al.

(10) Patent No.: US 7,328,588 B2
(45) Date of Patent: Feb. 12, 2008

(54) ARRANGEMENT FOR COOLING PLUG-IN UNITS ARRANGED ON TOP OF EACH OTHER IN A COMPONENT SUPPORT OR RECEIVING HOUSING

(75) Inventors: Andreas Müller, Freudenberg (DE); Joachim Maul, Ehringshausen (DE)

(73) Assignee: Rittal GmbH & Co. KG, Herborn (DE)

( * ) Notice: Subject to any disclaimer, the term of this patent is extended or adjusted under 35 U.S.C. 154(b) by 364 days.

(21) Appl. No.: 11/082,231

(22) Filed: Mar. 16, 2005

(65) Prior Publication Data
US 2005/0221661 A1 Oct. 6, 2005

(30) Foreign Application Priority Data
Mar. 17, 2004 (DE) .................... 10 2004 013 312

(51) Int. Cl.
*F25B 23/12* (2006.01)
(52) U.S. Cl. ..................... 62/259.2; 361/699
(58) Field of Classification Search ............... 62/259.2; 165/80.4, 104.33; 361/699, 720
See application file for complete search history.

(56) References Cited
U.S. PATENT DOCUMENTS

| 5,570,270 A | * | 10/1996 | Naedel et al. | 361/687 |
| 6,747,869 B2 | * | 6/2004 | Dong | 361/687 |
| 7,016,192 B2 | * | 3/2006 | Beihoff et al. | 361/689 |
| 7,134,607 B2 | * | 11/2006 | Ozawa et al. | 236/49.3 |

* cited by examiner

*Primary Examiner*—Melvin Jones
(74) *Attorney, Agent, or Firm*—Pauley Petersen & Erickson

(57) ABSTRACT

An arrangement for cooling heat-generating built-in devices housed in plug-in units, wherein the plug-in units are arranged on top of each other in a component support or receiving housing, a cooling arrangement receives the coolant for the plug-in units to be cooled and returns the cooled coolant to the plug-in units, and the components of the cooling arrangement are housed in an insertion housing installed in the component support or receiving housing. Because of a simple attachment of damping elements to the insertion housing and their adjustment, an uncoupling with the plug-in units is achieved, so that sensitive built-in components of the plug-in units are no longer negatively affected by shocks and vibrations of the components of the cooling arrangement in the insertion housing.

19 Claims, 2 Drawing Sheets

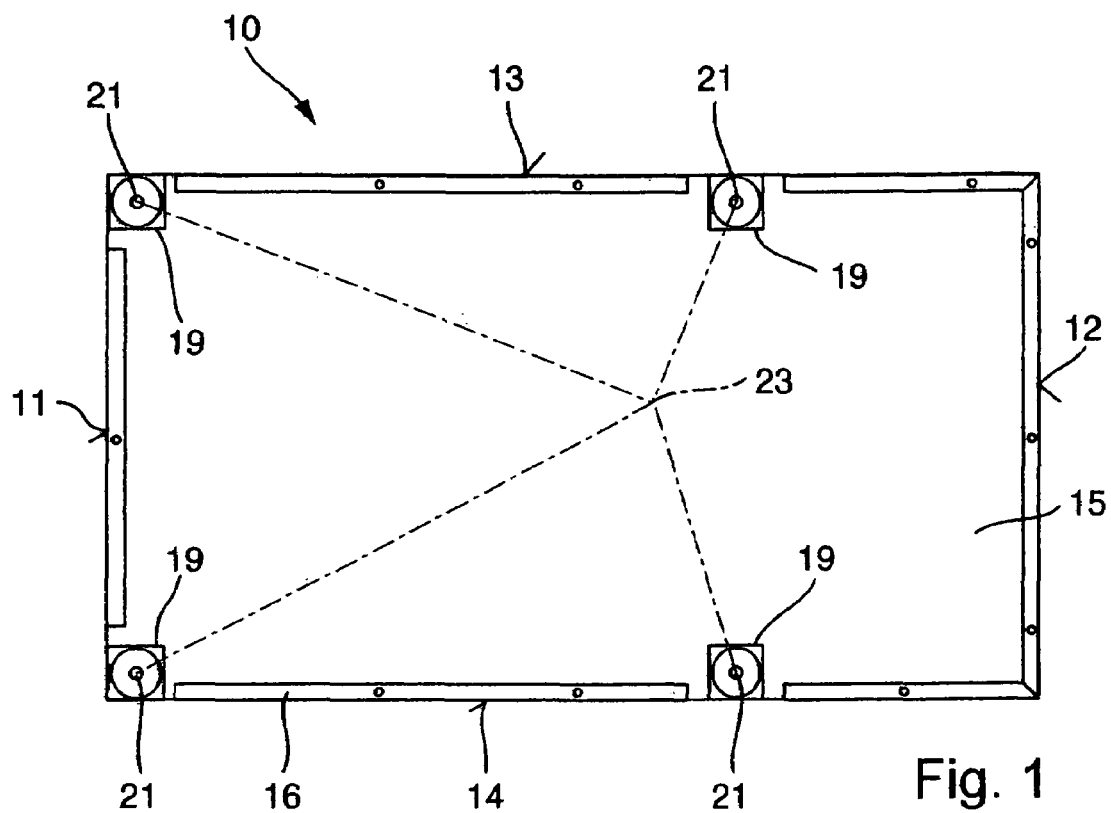
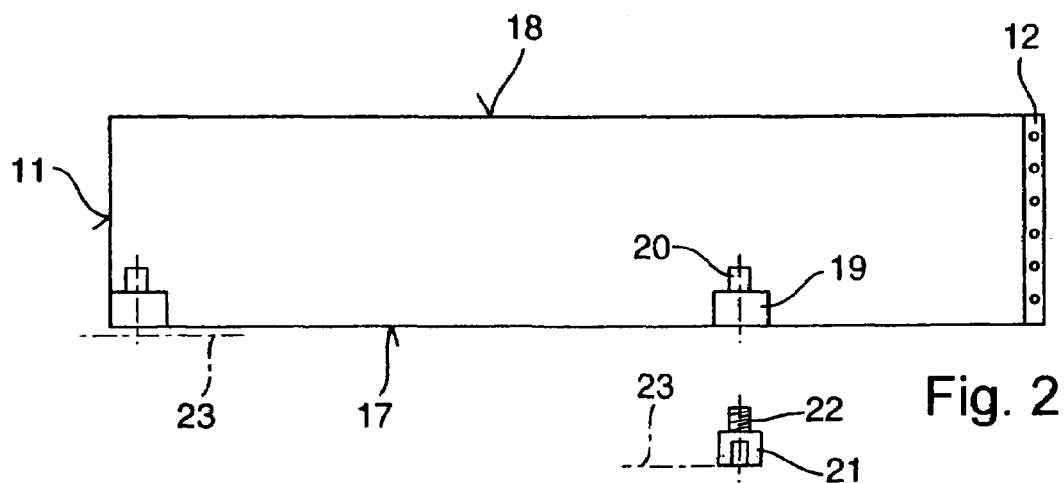

“ARRANGEMENT FOR COOLING PLUG-IN UNITS ARRANGED ON TOP OF EACH OTHER IN A COMPONENT SUPPORT OR RECEIVING HOUSING”

BACKGROUND OF THE INVENTION

1. Field of the Invention

This invention relates to an arrangement for cooling heat-generating built-in devices housed in plug-in units, wherein the plug-in units are arranged on top of each other in a component support or receiving housing, wherein a cooling arrangement receives the coolant for the plug-in units to be cooled and returns it cooled to the plug-in units, and wherein the components of the cooling arrangement are housed in an insertion housing installed in the component support or receiving housing.

2. Discussion of Related Art

Cooling causes various difficulties in connection with component supports or receiving housings which are densely occupied by plug-in units. The components of the cooling arrangement contained in the insertion housing generate shocks of various sizes, which are transmitted to the plug-in units. If sensitive electronic built-in devices are contained in the plug-in units, this can easily lead to malfunctions of the built-in devices or even to their breakdown.

Attempts have been made to remove this source of trouble by fastening the components of the cooling arrangement in the insertion housing by damping elements, which intercept the vibrations generated by the components and damp them so that they cannot be directly transmitted via the insertion housing for the cooling arrangement to the plug-in units housed in the component support or receiving housings and thus to their built-in devices. However, this requires an increased cost for parts and costs for the cooling arrangement.

SUMMARY OF THE INVENTION

It is one object of this invention to separate the insertion housing with the cooling arrangement from the plug-in units in a device in accordance with the type mentioned above but in a simpler manner and so that the transmission of shocks and vibrations of the components from the cooling arrangement is prevented, while not hampering the compact construction of the component support or receiving housing.

In accordance with this invention, this object is attained with an insertion housing that has damping elements, which are installed recessed in an underside, which only slightly project from the underside and define a support surface of the insertion housing only for placing it on the bottom of the component support or receiving housing or a cover of a plug-in unit. The connectors for the coolant to be cooled or that have been cooled are arranged at the back of the insertion housing.

The insertion housing with the cooling arrangement is placed into the component support or receiving housing via the damping elements and thus contacts the component support, the receiving housing or a plug-in unit only via the damping elements, so that although the insertion housing can vibrate or oscillate, the transmission of the vibrations or shocks to other parts is greatly damped.

One advantage of the device in accordance with this invention is that, like the plug-in units, the insertion housing with the cooling arrangement is suitable for a compact occupation of the component support or receiving housing, because the damping elements, which only slightly protrude from the underside of the insertion housing, do not negatively affect the structural height of the insertion housing. The space requirement in this direction is negligible.

So that the insertion housing with the cooling arrangement allows a secure placement, in one embodiment the underside of the insertion housing has at least three damping elements distributed over the surface of the underside.

In another embodiment, with the installation of the damping elements in the underside of the insertion housing, lateral walls of the insertion housing defining the sides have an edge beveled toward the inside in the area of the underside or a bottom which covers the underside and is connected with the edge. The edge and the bottom are recessed in the area of or near the damping elements. It is thus possible to use practically the entire area of the bottom for mounting the components.

The required insertion of the damping elements together with the formation of the support surface is achieved if receptacles are formed in the area of or near the recesses between the edge and the bottom in the insertion housing, which are open toward the underside and are threaded. Cylindrical damping elements can be inserted into the receptacles and are screwed with a threaded part into the threaded receivers. The free front faces of the damping elements define the support surface of the insertion housing protruding from the underside. Also, it is possible with these screw connections to perform an adjustment of the damping elements and therefore an alignment of the support surface of the insertion housing.

For forming the receptacles, in one embodiment the receptacles are designed to be cup-like and are fastened with outside directed flanges on the inside of the bottom, wherein the flanges enclose the recesses in the bottom.

An optimal support surface of the insertion housing with the cooling arrangement is provided if the front faces of four damping elements, which are distributed in a rectangle over the underside of the insertion housing, define the support surface, wherein two of the damping elements are arranged in the area of or near the corners between the front and the connecting sides. The other two damping elements are arranged spaced apart and parallel with the back in the area where the sides meet the back.

The formation of cooling circuits for the installed plug-in units is simplified if the connectors are designed as connecting elements for connecting lines to the plug-in units which are preferably laid out as quick-release connectors with opening functions. The connectors can be installed in pairs, each for a feed line for the coolant to be cooled and a return line for the cooled coolant, wherein the pairs are preferably placed on top of each other at the back of the insertion housing.

In another embodiment, the connectors in the area of or near the back are combined into a common feed line and a common return line and are connected with the components of the cooling arrangement. The interior structure with the cooling arrangement need not be altered if a different number of cooling circuits is desired. In this case, the quick-release connection is advantageous because it can only operate the cooling circuit when the connectors are occupied.

It is also advantageous if the structure has the number of pairs of connectors matched to the maximum number of the plug-in units housed in the component support or receiving housing.

In accordance with this invention, a liquid or gaseous coolant can be used for cooling. The components of the cooling arrangement in the insertion housing are then matched to the coolant used and can be appropriately selected. The prior art may offer a sufficient number of options. For example, with a liquid coolant a compressor, a pump, a condenser and an evaporator are installed in the cooling arrangement, whose functions are known and which permit the realization of large cooling outputs by the selection of the components.

BRIEF DESCRIPTION OF THE DRAWINGS

This invention is explained in greater detail in view of an exemplary embodiment, wherein:

FIG. 1 shows a view of an underside of an insertion housing suitable for installing a cooling arrangement;

FIG. 2 shows a schematic lateral view of the insertion housing in accordance with FIG. 1;

DESCRIPTION OF PREFERRED EMBODIMENTS

Figure 3:
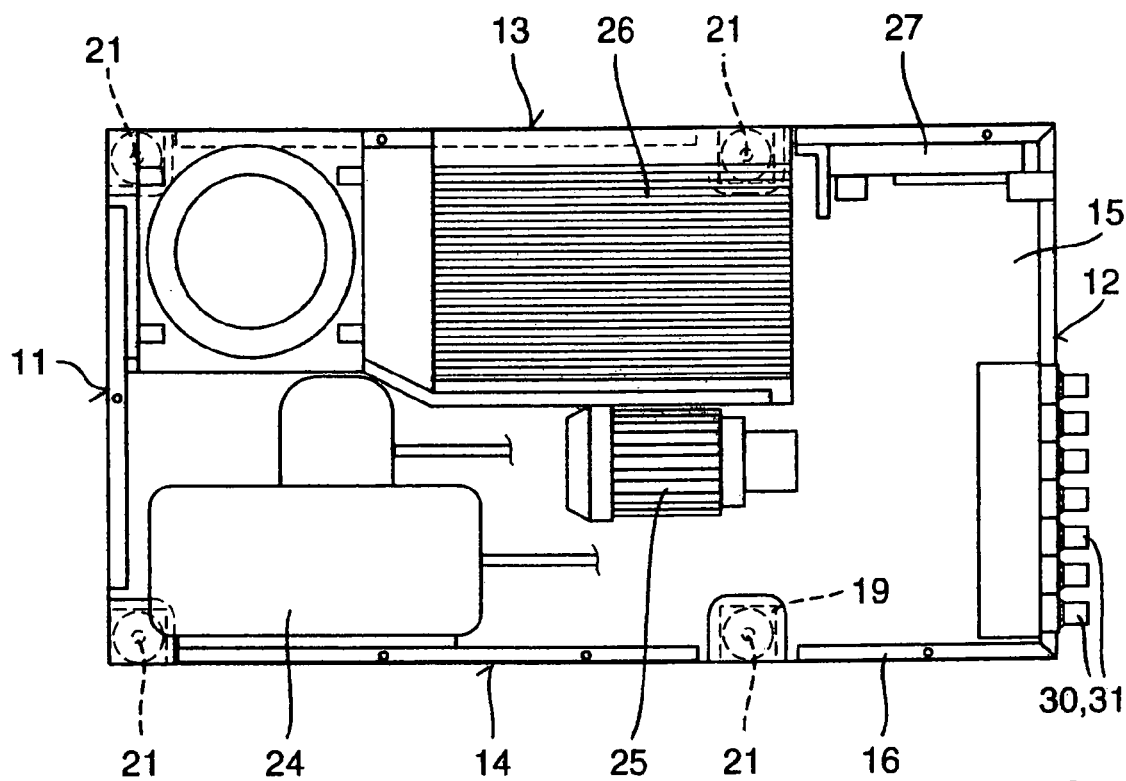
FIG. 3 shows a view of an underside of the insertion housing with installed components of a cooling arrangement for liquid coolant.

Basically, the insertion housing 10 in FIGS. 1 and 2 is constructed as a plug-in unit with installed components, wherein the front 11 and the back 12, as well as the sides 13 and 14 are vertically oriented and are formed by lateral walls. The bottom 17 on the underside 15 as shown in FIG. 2 is removed, so that the beveled edges 16 of the lateral walls can be viewed. The bottom 17 is attached to the beveled edges 16 and closes the insertion housing 10 off below and is used as a mounting plate for the components of the cooling arrangement, yet to be discussed. The top 18 of the insertion housing 10 is closed off by a ceiling 18.

Cup-like receptacles 19 are inserted at corner areas between the front 11 and the adjoining sides 13 and 14 and can be connected with the front 11 and the respective adjoining lateral wall assigned to the side 13 or 14. In addition, two further receptacles 19 are connected with the lateral walls of the sides 13 and 14, which extend parallel with and are spaced apart from the back 12. The beveled edges 16 and the bottom 17 are recessed in the area of or near the open sides of the receptacles 19, so that the threaded receivers 20 cut into the bottom of the receptacles 19 are accessible. Cylinder-shaped damping elements 21, which have a threaded part 22 facing the bottom of the receptacle 19, are screwed into the receptacles 19. In the screwed in and adjusted state, the fronts of the damping elements 21 facing away from the threaded parts 22 define a rectangular support surface 23, which is only slightly spaced apart from the outside of the bottom 17, as illustrated in FIG. 2. It is easy to see that this installation of the damping elements 21 at the insertion housing 10 has only a negligible effect on the structural height of the insertion housing 10 and can thus be disregarded. Because the lateral walls of the front 11 and the sides 13 and 14 have no fastening and/or guide elements to the component support or receiving housing, the insertion housing 10 is placed into the component support or receiving housing only via the damping elements 21 with the dismounted support surface 23. In this case, as the lowermost unit only, the insertion housing 10 rests on the bottom of the component support or receiving housing, for example. But the insertion housing 10 can be arranged at any desired height position in the component support or receiving housing if it can be placed above on the top of a plug-in unit.

Figure 4:
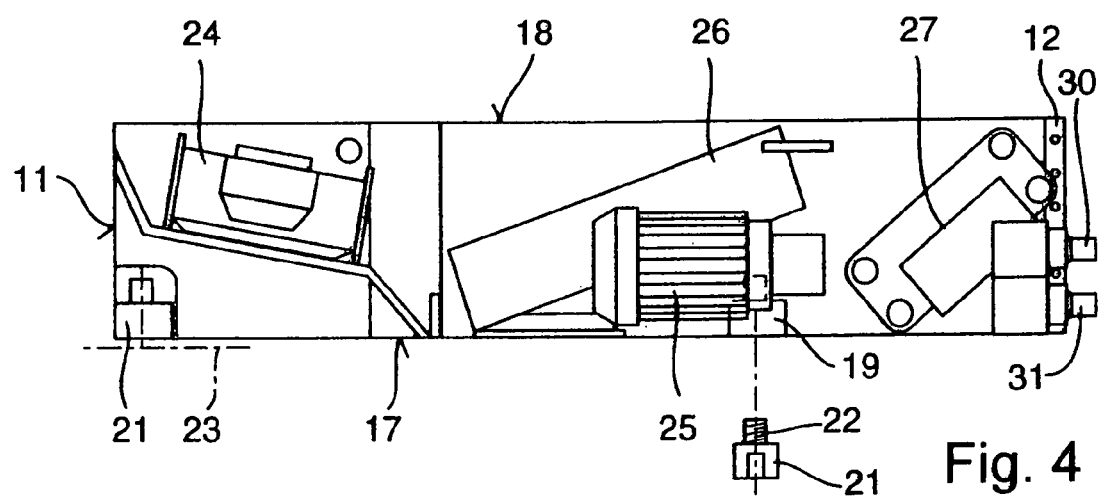
FIG. 4 shows a lateral view with the lateral wall removed on a side shown in FIG. 3.

With the insertion housing 10 in accordance with FIGS. 3 and 4 the components of the cooling arrangement are already installed. As shown, the receptacles 19 for the damping elements 21 do not interfere with this installation, because at the places provided they claim only a small part of the interior of the insertion housing 10. If a liquid coolant is used, a compressor 24, a pump 25, a condenser 26 and an evaporator 27 are used in a manner known per se as the components of the cooling arrangement. The functions of these components are known and can be selected for different cooling outputs. Also, the structure of the cooling arrangement with these components can be varied in various ways. The design and selection of the components of the cooling arrangement does not affect the installation in accordance with this invention of the insertion housing with the cooling arrangement in the component support or receiving housing.

It remains to be mentioned that the connectors 30 and 31 for the coolant to be cooled, which comes via feed lines from the plug-in units, and the cooled coolant, which is returned to the plug-in units, are arranged on the back 12 of the insertion housing 10.

The connectors 30 and 31 for the feed and return lines are attached in pairs above each other and matched to the maximum number of plug-in units which can be housed in the component support or the receiving housing. Unoccupied connectors 30, 31 are normally closed. If a line is connected by a quick-release element, the connection with the cooling arrangement is established. Thus it is possible to combine all connectors 30 for feed lines and all connectors 31 for return lines and to connect them with the components of the cooling arrangement. The number of occupied connectors is then freely selectable without making additional arrangements.

German Patent Reference 10 2004 013312.3-34, the priority document corresponding to this invention, and its teachings are incorporated, by reference, into this specification.

What is claimed is:

1. An arrangement for cooling heat-generating built-in devices housed in plug-in units, wherein the plug-in units are arranged on top of each other in a component support or receiving housing, wherein a cooling arrangement receives a coolant for the plug-in units to be cooled and returns the coolant cooled to the plug-in units, and wherein components of the cooling arrangement are housed in an insertion housing installed in the component support or receiving housing, the arrangement comprising:

the insertion housing (10) having damping elements (21) installed recessed in an underside (15) which only slightly project from the underside (15) and define a support surface (23) of the insertion housing (10) only for placing on a bottom of one of the component support, the receiving housing and a cover of a plug-in unit, and the connectors (30, 31) for the coolant to be cooled or cooled are arranged at a back (12) of the insertion housing (10).

2. The arrangement in accordance with claim 1, wherein the underside (15) of the insertion housing (10) has at least three damping elements (21) distributed over a surface of the underside (15).

3. The arrangement in accordance with claim 2, wherein lateral walls of the insertion housing (10) defining the sides (11 to 14) have an edge (16) beveled toward an inside near the underside (15), the bottom that covers the underside (15) is connected with an edge (16), and the edge (16) and the bottom (17) are recessed near the damping elements (21).

4. The arrangement in accordance with claim 3, wherein near recesses between the edge (16) and the bottom in the insertion housing (10) receptacles (19) are formed, which are open toward the underside (15) and have threaded receivers (20), cylindrical damping elements (20) are insertable into the receptacles (19) and are screwed with a threaded part (22) into the threaded receivers (20), and free front faces of the damping elements (21) define the support surface (23) of the insertion housing (10) protruding from the underside (15).

5. The arrangement in accordance with claim 4, wherein the receptacles (19) are shaped as a cup and are fastened with outside directed flanges on the inside of the bottom (17) wherein the flanges enclose the recesses in the bottom (17).

6. The arrangement in accordance with claim 5, wherein the front faces of four of the damping elements (21) are distributed in a rectangle over the underside (15) of the insertion housing (10) and define the support surface (23), wherein two of the damping elements (21) are arranged near corners between the front (11) and the connecting sides (13, 14), and the other two damping elements (21) are arranged spaced apart and parallel with the back (12) where the sides (13, 14) meet the back (12).

7. The arrangement in accordance with claim 6, wherein the connectors (30, 31) are connecting elements for connecting lines to the plug-in units which have quick-release connectors with opening functions.

8. The arrangement in accordance with claim 7, wherein the connectors (30, 31) are installed in pairs, each for a feed line for the coolant to be cooled and a return line for the cooled coolant, and the pairs are placed on top of each other at the back (12) of the insertion housing (10).

9. The arrangement in accordance with claim 8, wherein the connectors (30, 31) near the back (12) are combined into a common feed line and a common return line and are connected with the components of the cooling arrangement.

10. The arrangement in accordance with claim 9, wherein a number of pairs of the connectors (30, 31) is matched to a maximum number of the plug-in units housed in one of the component support and the receiving housing.

11. The arrangement in accordance with claim 10, wherein one of a liquid and a gaseous coolant are matched to the components of the cooling arrangement.

12. The arrangement in accordance with claim 11, wherein with the liquid coolant the compressor (24), the pump (25), the condenser (26) and the evaporator (27) are used as components of the cooling arrangement.

13. The arrangement in accordance with claim 1, wherein lateral walls of the insertion housing (10) defining the sides (11 to 14) have an edge (16) beveled toward an inside near the underside (15), the bottom that covers the underside (15) is connected with an edge (16), and the edge (16) and the bottom (17) are recessed near the damping elements (21).

14. The arrangement in accordance with claim 3, wherein the receptacles (19) are shaped as a cup and are fastened with outside directed flanges on the inside of the bottom (17) wherein the flanges enclose the recesses in the bottom (17).

15. The arrangement in accordance with claim 1, wherein the front faces of four of the damping elements (21) are distributed in a rectangle over the underside (15) of the insertion housing (10) and define the support surface (23), wherein two of the damping elements (21) are arranged near corners between the front (11) and the connecting sides (13, 14), and the other two damping elements (21) are arranged spaced apart and parallel with the back (12) where the sides (13, 14) meet the back (12).

16. The arrangement in accordance with claim 1, wherein the connectors (30, 31) are connecting elements for connecting lines to the plug-in units which have quick-release connectors with opening functions.

17. The arrangement in accordance with claim 7, wherein the connectors (30, 31) near the back (12) are combined into a common feed line and a common return line and are connected with the components of the cooling arrangement.

18. The arrangement in accordance with claim 7, wherein a number of pairs of the connectors (30, 31) is matched to a maximum number of the plug-in units housed in one of the component support and the receiving housing.

19. The arrangement in accordance with claim 1, wherein one of a liquid and a gaseous coolant are matched to the components of the cooling arrangement.

* * * * *